INVENTOR
MORTON D. REEBER

BY S. P. Tedesco

ATTORNEY

March 8, 1966 M. D. REEBER 3,239,787

SUPERCONDUCTIVE COMPONENT

Original Filed May 20, 1959 2 Sheets-Sheet 2

United States Patent Office 3,239,787
Patented Mar. 8, 1966

3,239,787
SUPERCONDUCTIVE COMPONENT
Morton D. Reeber, Shrub Oak, N.Y., assignor to International Business Machines Corporation, New York, N.Y., a corporation of New York
Continuation of application Ser. No. 814,495, May 20, 1959. This application May 4, 1962, Ser. No. 192,570
5 Claims. (Cl. 338—32)

This invention relates to superconductive components and, more particularly, to improved superconductive components having accurately controlled and reproducible characteristics as described in the copending United States patent application, Serial No. 814,495, now abandoned, to which this application is related as a continuation.

The phenomenon of superconductivity, that is, the ability of certain materials to exhibit zero electrical resistance, has heretofore been employed in the design of electrical circuits. Briefly, the basic unit of these circuits consists of a first superconductive element, the resistance of which, superconducting or normal, is controlled by a second superconductive element. Circuits fabricated of these superconductive elements have particular utility in the design of computers by reason of their small size, low power consumption, and rapid response time. The most promising superconductive components at present, especially with respect to response time, are of the thin film type described in copending application Serial No. 625,512, filed November 30, 1956, on behalf of Richard L. Garwin, and assigned to the assignee of this invention. The required thin films of both metals and insulators have a variety of complex geometries and are preferably fabricated by thermal evaporation of the materials in a vacuum. However, it has been found that minute amounts of impurities are capable of greatly altering the characteristics of superconductive elements. These impurities are particularly important when the elements are of the thin film type and may result from contamination of the substrate by residual gas molecules in the vacuum chamber during the evaporation process as well as impurities within the superconductive material itself.

Some of the characteristics influenced by impurities in superconductive elements which are important in the operation of the electrical circuits of cryogenic computers will be more particularly understood from the following definitions and discussion. The resistance of a pure superconductive element as a function of temperature is essentially discontinuous. That is, for all temperatures less than a critical temperature and in the absence of an applied magnetic field a superconductive element is superconducting; for all temperatures above this critical temperature, the superconductive element is resistive. The addition of impurities to the superconductive element causes a departure from this characteristic and there then exists a range of temperatures wherein the superconductive element is neither wholly superconducting nor completely resistive. In the design of gating and switching circuits for cryogenic computers, it is desirable that the intermediate state not exist whereby the superconductive element exhibit only zero or normal resistance. Additionally, the critical temperature at which the transition between states occurs is altered by the addition of minute amounts of impurities. Thus, when the resistance of a superconductor is to be controlled by an external applied magnetic field, the threshold sensitivity of the superconductive element is dependent on the critical temperature. It is, therefore, desirable to control the impurities in order to obtain a predetermined critical temperature and thereby obtain reliable trigger action. Finally, the resistivity of superconductive elements which are switched between the superconducting and normal resistance states, is quite important in determining the operating speed of a cryogenic computer, since speed is directly proportional to the resistivity. Again, the addition of impurities results in a change in resistivity and, generally, causes the resistivity to increase.

Because the superconductive properties of superconductive elements are altered by the addition of impurities, it has generally been the practice when fabricating superconductive circuits to employ superconductive elements having minimum possible impurities in order to obtain as sharp transition as possible.

Because superconductive alloys, in general, have a larger value of resistance in the normal state than do superconductive elements, it would be desirable to fabricate superconductive components therefrom to obtain higher operating speeds in a cryogenic computer. However, in fabricating alloys, it is desirable to produce superconductive elements which are as homogeneous as possible. A cursory examination of the phase diagram of most alloy systems is sufficient to indicate that the process of solidification tends, in most cases, to upset the homogeneity that can be obtained in the liquid phase with the result that the solidified material contains a finite range of composition depending on the details of the fabrication process. Alloy superconductors of the prior art have, therefore, exhibited a transition between the superconducting and normal resistance states that is spread out over a wide range of temperature or applied magnetic field as different microscopic portions of the alloy have different critical temperatures. Thus, these alloys have not been suitable for use in superconductive components since their broad transitions reduce response time and their transition characteristics are almost impossible to reproduce as the transition width is determined by the variation of homogeneity throughout the specimen. A summary of transition measurements of various alloys is contained in an article entitled, "The Transition to Superconductivity," by P. R. Doidge which appeared in the Philosophical Transactions of the Royal Society, Vol. 248, A248, pages 553–573, March 1956. In this article it is stated that alloy transitions are comparatively broad, having no regular development of width or shape with increasing impurity.

What has been discovered are novel superconductive components wherein advantage is taken of a particular property resulting from the alloying of materials to produce superconductive elements having transition sharpness comparable to that of the purest monatomic specimens while retaining the increased resistivity afforded by alloy superconductors. Additionally, the critical temperature of these superconductive elements, that is, the temperature at which the material switches between the superconducing and normal resistance states, is relatively independent of the degree of heterogeneity present throughout the element.

Briefly, the alloy superconductive element according to one aspect of the invention consists, essentially, of a first superconductive material to which is added a predetermined amount of a second superconductive material. In this manner, a superconductive element is obtained in which the desired critical temperature and specimen resistivity are obtained at the position of the minimum in the critical temperature versus composition curve. In this range of composition, it is not only possible to obtain superconductive elements with remarkably sharp transitions but to obtain elements whose superconducting critical temperatures vary little from specimen to specimen.

It is an object of the invention to provide an improved superconductive component.

Another object of the invention is to provide a superconductive component having accurately controlled and reproducible characteristics.

Yet another object of the invention is to provide a superconductive component comprising a superconductive element having transition sharpness comparable to that obtained in the purest monatomic specimens.

Still another object of the invention is to provide alloy superconductive elements whose critical temperatures vary little from specimen to specimen.

A futher object of the invention is to provide superconductive elements exhibiting increased values of resistivity.

A still further object of the invention is to provide an alloy superconductive component useful in cryogenic computers.

The foregoing and other objects, features and advantages of the invention will be apparent from the following more particular description of preferred embodiments of the invention as illustrated in the accompanying drawings.

Figure 1:
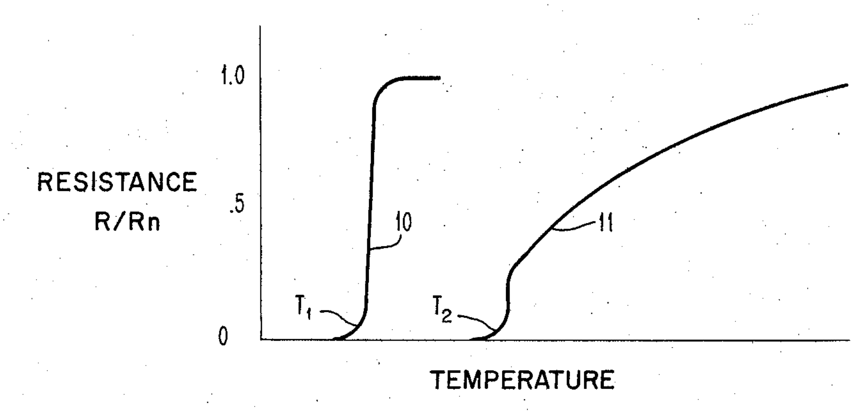
FIG. 1 illustrates the transition between the superconducting and normal resistance state for various materials.

Referring now to the drawings, FIG. 1 shows the transition curves of both a pure superconductor and a typical alloy superconductor. As illustrated by curve 10 of FIG. 1, a pure superconductor remains superconducting as the temperature increases from absolute zero until the critical temperature $T_1$ is reached at which point a relatively discontinuous jump to the normal resistance value occurs. The transition width of this class of superconductors is in the order of $1 \times 10^{-3}$ degrees Kelvin depending on the degree of purity of the specimen. However, as illustrated by curve 11, the transition of a typical alloy superconductor is markedly different. Again, the alloy superconductor remains superconducting as the temperature increases from absolute zero until the temperature $T_2$ is reached. At this temperature only a portion of the normal resistance is obtained, the resistance then slowly increasing as the temperature further increases. The transition width of alloy superconductors is typically in the order of 1 or more degrees Kelvin depending on the particular alloy. This broad transition results from the fact that, in general, it is difficult to obtain a homogeneous superconductive alloy, and, therefore, each microscopic portion of the superconductor has its individual critical temperature. Thus, the initial jump indicated at $T_2$ of curve 11 results from all of the portions of the specimen having critical temperature $T_2$ becoming resistive. As the temperature is further increased, additional portions of the specimen become resistive, individually, thereby resulting in the spread of the transition curve as shown.

It has been known that the critical temperature of various alloys is a function of their composition and small variations in composition can result in effective large changes of critical temperature. However, over a limited range of composition the slope of this curve (see FIG. 2) approximates zero, and applicant has discovered that alloys having this composition, although not homogeneous throughout, can still exhibit sharp transitions. This results from the fact that although each microscopic portion may have its individual critical temperature, yet all of these various temperatures can be maintained within a spread of less than $1 \times 10^{-3}$ degrees Kelvin.

As an aid in understanding the invention only, the following specific values will be employed in an example of one alloy of the invention, it being understood that various materials and compositions may be employed to obtain the advantages of the invention.

A useful material for forming superconductive components is indium having a critical temperature of approximately 3.40 degrees Kelvin. The addition of a second superconducting material as, by way of example, mercury initially results in a lowering of this critical temperature as is shown by the curve 20 of FIG. 2, wherein an alloy of indium and mercury containing 1% mercury has a critical temperature of about 3.355 degrees Kelvin. Increasing the percentage of mercury results in an increase in the critical temperature. Thus, an indium-mercury alloy containing 5 atomic percent mercury has a critical temperature of about 3.435 degrees Kelvin. However, as indicated by curve 20, all the alloys having between 1.5 and 2 atomic percent mercury have essentially the same critical temperature. It thus may be observed that an indium-mercury alloy containing, by way of example, 1.75 atomic percent mercury will have a sharp transition provided only that the composition throughout the specimen does not exceed the boundaries of 1.5 and 2 atomic percent mercury. According to the method of the invention, superconductive components comprising an indium-mercury alloy have been fabricated which do in fact exhibit the expected sharp transition.

Figure 2:
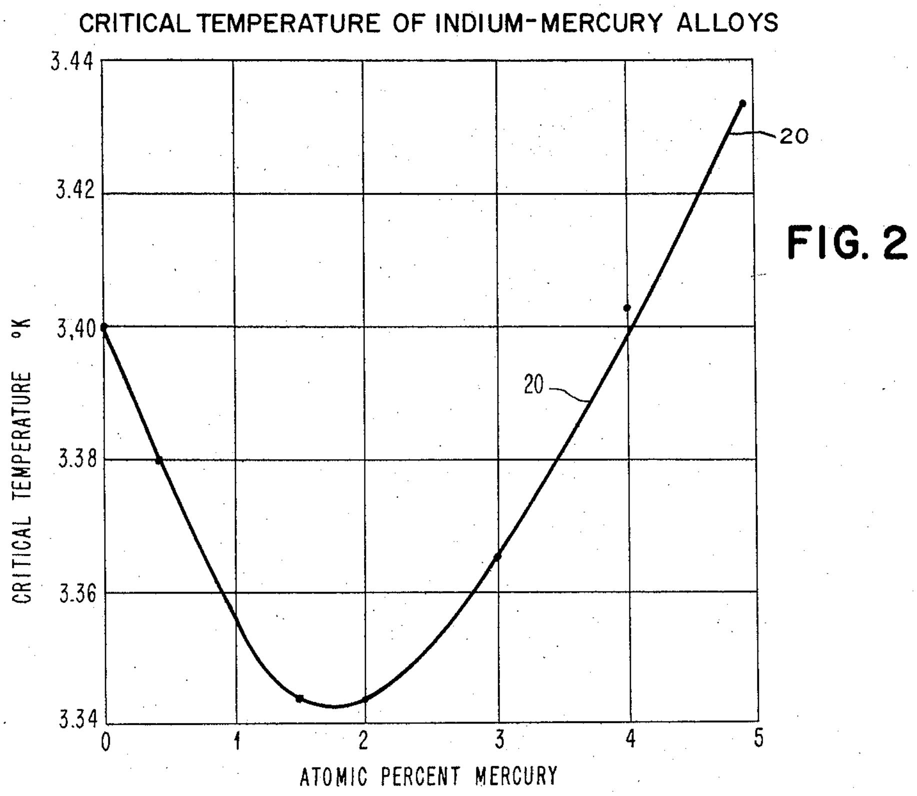
FIG. 2 illustrates the variation of critical temperature as a function of composition of an alloy.
Figure 3:
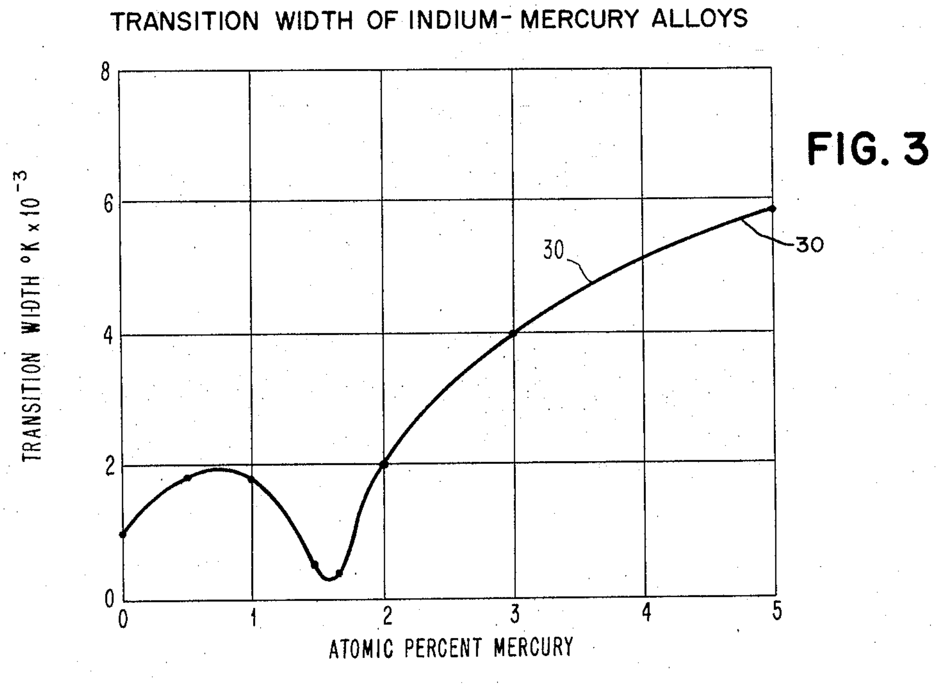
FIG. 3 illustrates the variation of transition width as a function of composition of an alloy.

Referring now to FIG. 3, curve 30 illustrates variations in transition width as a function of the percentage of mercury in the alloy. As can be seen in FIG. 3, the minimum transition width coincides with the minimum slope portion of the critical current versus composition curve of FIG. 2. In this manner, alloy superconductive elements exhibit increased resistivity, sharp transitions, and are relatively insensitive to the composition thereof.

Figure 4:
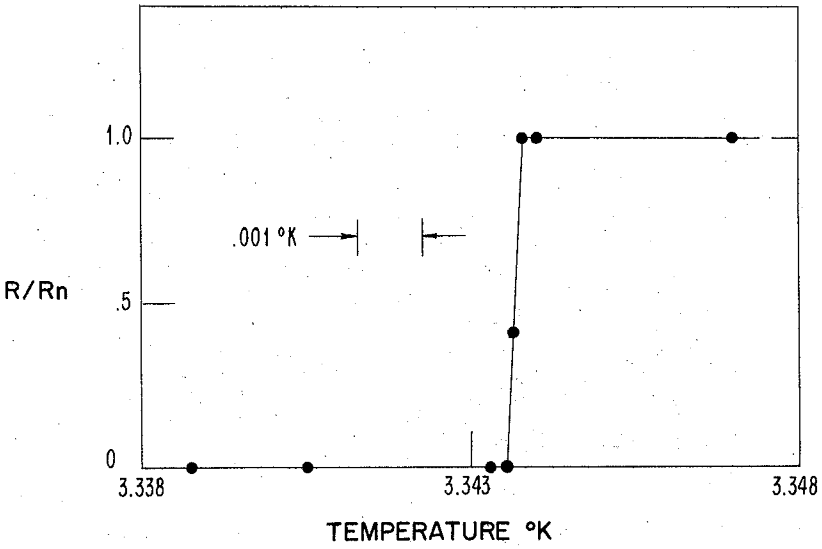
FIG. 4 illustrates the transition curve of a superconductive component formed of superconductive alloys in accordance with this invention.

The alloys for forming superconductive components in accordance with this invention are preferably fabricated in the following novel manner. Each of the selected superconductive materials are reduced to liquid form and then thoroughly mixed in a vacuum to form a homogeneous solution. The alloy whose characteristics are illustrated in FIG. 2 and FIG. 3 was subjected to violent agitation, for about 15 minutes at a temperature of 175 degrees centigrade. In order to obtain the maximum homogeneity, the liquid solution is subjected to quenching in an oil bath. The solidified material is then extruded through a die in the desired shape. The extruded material is then annealed for a time sufficient to ensure that each microscopic portion of the specimen has a crtical temperature within the predetermined boundaries. Again, as a specific example, the hereinbefore described alloy was subjected to a temperature approximately nine-tenths of its melting temperature in a vacuum for a few hundred hours. The alloy fabricated by the method of the invention had a transition curve as shown in FIG. 4 which illustrates the mercury alloy. The transitions of the alloy of the invenmercury alloy. The transitions of the alloy of the inven tion when subjected to a magnetic field were likewise sharp enough to be considered, for all practical purposes, discontinuous.

Figure 5:
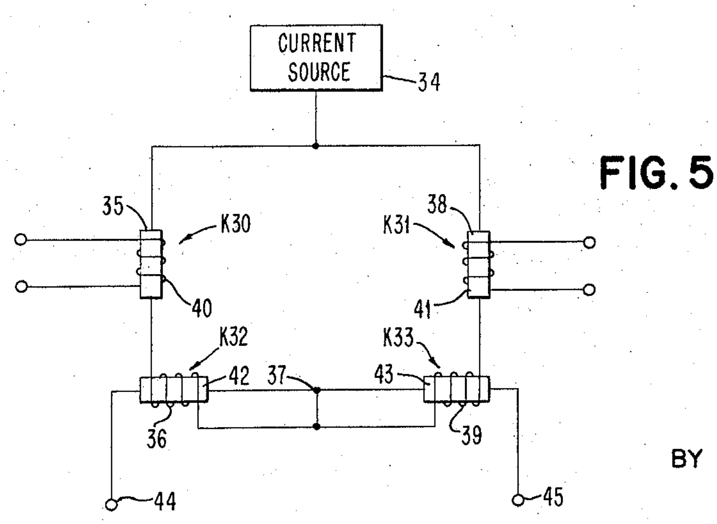
FIG. 5 illustrates a circuit employing the superconductive components formed of alloys in accordance with this invention.

A bi-stable circuit comprising superconductive components formed of alloys as hereinabove described is illustrated in FIG. 5. Each of the superconductive components K30, K31, K32, and K33 includes a first superconductive element or gate conductor, the resistance of which, superconducting or normal, is determined by current flow through a second superconductive element or control conductor. Each of the superconductive components or cryotrons in FIG. 5 are illustrated as of the conventional wire wound type as an aid in understanding the operation of the circuit but it should be understood that cryotrons of the thin film type disclosed in the hereinbefore referenced copending application Serial No. 625,512, may also be employed.

In the circuit of FIG. 5, current flows from a current source 34 through one of a pair of parallel paths to terminal 37. The first path includes a gate 35 of cryotron K30 and a control conductor 36 of cryotron K32. The second path includes a gate 38 of cryotron K31 and a control conductor 39 of cryotron K33. One or the other of these parallel current paths is selectively rendered resistive under control of current flow through the control conductors 40 and 41 of cryotrons K30 and K31, respectively. Current from terminal 37 flows to either terminal 44 or 45 depending on whether current from source 34 is flowing in either the first or second path. Thus, current flow through control conductor 36 is effective to render the gate 42 of cryotron K32 resistive so that all the current from terminal 37 flows through the superconductive gate 43 of cryotron K33 to terminal 45. Similarly, current flow through control conductor 39 renders gate 43 of cryotron K33 resistive so that the current from terminal 37 flows through the superconducting gate 42 of cryotron K32 to terminal 44.

It will be understood, that in order to ensure rapid switching of the current from source 34 to one or the other parallel current paths by means of the control conductors 40 and 41, the characteristics of cryotrons K30 and K31 must be accurately defined. Thus, gates 35 and 38 of cryotrons K30 and K31, respectively, must have a predetermined critical temperature so that input current flowing through either control conductors associated therewith is effective to render them resistive. Additionally, a sharp transition is required to ensure the gate conductor is driven completely resistive when a current pulse of short duration is applied to either of the control conductors. As hereinbefore described, the superconductive component of the invention, may be fabricated whereby each of these important characteristics may be accurately controlled within well defined limits.

Thus, what has been shown and described is a novel superconductive component useful in cryogenic computers wherein controlled alloying is employed in order to accurately determine the characteristics therein. By controlling the amount of significant impurities in a superconductive element, superconductive components having sharp transitions, predetermined critical temperatures, and increased resistivity may be obtained.

While the invention has been particularly shown and described with reference to preferred embodiments thereof, it will be understood by those skilled in the art that various changes in form and details may be made therein without departing from the spirit and scope of the invention.

What is claimed is:

1. A superconductive component comprising a gate conductor and means for switching said gate conductor between superconductive and normal resistance states, said gate conductor being fabricated of an alloy consisting essentially of first and second superconductive materials, said second material being substantially uniformly distributed within said first material, said second material being proportioned to minimize the slope of the critical transition temperature versus composition curve of said alloy so as to impart to each microscopic portion of said gate conductor a critical temperature which deviates less than 0.001° Kelvin from the critical temperature of every other microscopic portion of said gate conductor.

2. A superconductive component as defined in claim 1 wherein said switching means includes a control conductor arranged in magnetic field applying relationship with said gate conductor.

3. A superconductive component comprising a gate conductor and a control conductor arranged in magnetic field applying relationship therewith, said control conductor being operative to switch said gate conductor between superconductive and normal resistance states, said gate conductor consisting essentially of an alloy of first and second superconductive materials, said second material being substantially uniformly distributed within said first material and proportioned to substantially minimize the slope of the characteristic critical temperature versus composition curve of said alloy to lessen variations in transition temperatures of microscopic portions of said alloy whereby said gate conductor exhibits a transition width substantially equal to and a resistivity greater than that of said first material.

4. A superconductive component as defined in claim 3 wherein said alloy forming said gate conductor consists essentially of 1.5 to 2.0 atomic percent mercury and the rest indium.

5. A superconductive component comprising a gate conductor and a control conductor arranged in magnetic field applying relationship therewith, said control conductor being operative to control the state of conductivity of said gate conductor, said gate conductor consisting essentially of an alloy of indium and mercury, said mercury being proportioned between 1.5 to 2.0 percent of said gate conductor and substantially uniformly distributed within said gate conductor whereby said gate conductor exhibits a critical temperature relatively insensitive to composition, a transition width less than $1 \times 10^{-3}$ degrees Kelvin, and a resistivity greater than the resistivity of either indium or mercury.

References Cited by the Examiner

UNITED STATES PATENTS

| | | | |
|---|---|---|---|
| 2,832,897 | 4/1958 | Buck | 307—88.5 |
| 2,936,435 | 5/1960 | Buck | 340—173.1 X |
| 2,983,889 | 5/1961 | Green | 338—32 |
| 3,091,702 | 5/1963 | Slade | 307—88.5 |

OTHER REFERENCES

Transactions of the Farady Society, volume 50, pages 676–681, 1954.

RICHARD M. WOOD, *Primary Examiner.*